United States Patent [19]

Kramler et al.

[11] Patent Number: 4,539,050
[45] Date of Patent: Sep. 3, 1985

[54] PROCESS FOR THE MANUFACTURE OF SEMICONDUCTOR WAFERS WITH A REAR SIDE HAVING A GETTERING ACTION

[75] Inventors: Josef Kramler, Burgkirchen; Franz Kuhn-Kuhnenfeld, Emmerting; Hans-Adolf Gerber, Burghausen, all of Fed. Rep. of Germany

[73] Assignee: Wacker-Chemitronic Gesellschaft Für Elektronik-Grundstoffe m.b.H., Burghausen, Fed. Rep. of Germany

[21] Appl. No.: 543,411

[22] Filed: Oct. 19, 1983

[30] Foreign Application Priority Data

Dec. 15, 1982 [DE] Fed. Rep. of Germany ....... 3246480

[51] Int. Cl.$^3$ .......................................... H01L 21/268
[52] U.S. Cl. .................................. 148/1.5; 29/576 B; 29/576 T; 148/33.2; 148/DIG. 60
[58] Field of Search ........................ 29/576 B, 576 T; 148/1.5, 33.2, DIG. 60

[56] References Cited

U.S. PATENT DOCUMENTS

| | | | |
|---|---|---|---|
| 3,905,162 | 9/1975 | Lawrence et al. | 148/175 X |
| 4,131,487 | 12/1978 | Pearce et al. | 148/1.5 |
| 4,144,099 | 3/1979 | Edmonds et al. | 148/1.5 |
| 4,257,827 | 3/1981 | Schwuttke et al. | 148/1.5 |
| 4,276,114 | 6/1981 | Takano et al. | 148/1.5 X |
| 4,319,119 | 3/1982 | Runge | 219/121 LM |

FOREIGN PATENT DOCUMENTS 2927220 1/1981 Fed. Rep. of Germany .

*Primary Examiner*—Brian E. Hearn
*Assistant Examiner*—Alan E. Schiavelli
*Attorney, Agent, or Firm*—Collard, Roe & Galgano

[57] ABSTRACT

For the manufacture of semiconductor wafers with a rear side having a gettering action in subsequent oxidation processes by means of the action of light, especially laser, radiation ("laser damage"), there are advantageously chosen wafers with a fine surface structure that contains faces that are inclined by at least 15° in the actual profile by comparison with the geometrically ideal profile of the surface according to known standards. As a result, in comparison to smooth surfaces, considerable savings in energy and time are achieved.

12 Claims, 8 Drawing Figures

|←—————| 50 μm

PROCESS FOR THE MANUFACTURE OF SEMICONDUCTOR WAFERS WITH A REAR SIDE HAVING A GETTERING ACTION

BACKGROUND OF THE INVENTION

The invention relates to a process for the manufacture of semiconductor wafers with a rear side having a gettering action in subsequent high-temperature processes. More particularly, it relates to such a process wherein dislocation networks are formed in the surface region of the rear side of the wafer by the action of light radiation.

In the manufacture of electronic components from semiconductor wafers, the point defects and impurities in the wafers are often the cause of undesirable phenomena, such as, for example, increased leakage currents at barrier layers and capacitors of integrated circuits.

Such point defects, point defect clusters and impurities can, however, be removed or "gettered" through the rear side of the wafer by various processes so that the front side of the wafer is free of defects being produced in the rear side of the wafer by means of certain treatments. During the high-temperature processes carried out in the course of the manufacture of semiconductor components, such as, e.g., oxidation at, usually, from 800° to 1250° C., these defects then exhibit their gettering action and draw or suck off the point defects, point defect clusters and impurities present in the wafer through the rear side of the wafer. One possible method of manufacturing such a wafer having a rear side with a gettering action comprises, for example, subjecting the rear side of the wafer to mechanical stress, for example by immersing it in a fluid bath of moving abrasive grains (cf. DE-OS 29 27 220), or by directed scratching (cf. U.S. Pat. No. 3,905,162). In those processes, however, there is always the risk of impurities because of the contact of the wafers with mechanical abrasives.

This risk can be avoided by treating the rear face of the wafers by laser radiation. It is known, for example according to U.S. Pat. No. 4,131,487, to vaporize semiconductor material in individual surface areas by laser treatment and thus to produce areas that have a gettering action in subsequent oxidation processes. However, this process requires a considerable expenditure of energy, involves loss of material and, in addition, as a result of the formation of vaporization pits or craters, impairs the surface quality of the semiconductor material so that, e.g., problems may arise when sucking down the wafers using vacuum chucks. Also, the process according to DE-OS 28 29 983, in which a layer on the rear side of the wafer is vaporized by a first laser pulse and then the dislocation network necessary for the gettering is produced by a second laser pulse, is similarly already expensive as far as energy is concerned, because of the vaporization step.

By contrast, processes according to which layers in the surface region of the semiconductor wafers are not vaporized but only melted require lower intensities of radiation energy. But in these processes too, as described, e.g., in *J. Electrochem. Soc.* 128. pages 1975–80 (1981), in Extended Abstract No. 485 Los Angeles Meeting Electrochemical Society, 14.–19.10.1979, and in U.S. Pat. No. 4,257,827, the energy requirement is still considerable and does not permit a broad economical use of this laser treatment, referred to as "laser damage" in technical language, for the rear side gettering of semiconductor wafers.

SUMMARY OF THE INVENTION

The object of the invention is therefore to provide a process that allows manufacture of semiconductor wafers having a rear side with a gettering action by means of treatment with light, especially laser, radiation, which is more economical compared with the state of the art and which reduces energy consumption.

This object is achieved according to the present invention by a process which is characterized in that semiconductor wafers are selected with a rear side that contains in its surface fine structure faces that are inclined by at least 15° with respect to the geometrically ideal surface, and that this rear side is melted, at least in parts, by the action of light radiation.

The phrase "geometrically ideal surface" is to be understood herein as the boundary of the body conceived as geometrically perfect which, for example, in the case of the surface of a semiconductor wafer, is a completely planar face. While, for example, the surface of mirror-polished semiconductor wafers approximately corresponds in its fine structure to the geometrically ideal surface, the surfaces of, for example, sawn, lapped or etched wafers differ to a greater or lesser extent in their fine structure from the geometrically ideal surface. These variations can be seen, e.g., after cleaving a wafer, by means of a suitable mirror-like specular cleavage face, by using, e.g., a light-optical microscope with adequate magnification. Such a cleavage face corresponds to a profile section through the semiconductor wafer and shows how the actual profile differs from the geometrically ideal profile. The angles between the tangents of falling or rising curve portions of the actual profile and the geometrically ideal profile then give approximately the angle at which the corresponding face in the fine surface structure of the semiconductor wafer is inclined with respect to the geometrically ideal surface. The terms used here, such as geometrically ideal surface, actual profile, geometrically ideal profile, profile section and the like are in this context to have the same meaning as given, for example, in DIN 4760, DIN 4761 and DIN 4762 for technical surfaces.

Unexpectedly, it was found that in the surface region of semiconductor wafers that contain in their surface fine structure faces inclined by at least 15° with respect to the geometrically ideal surface, dislocations develop as a result of melting parts of the surface by the action of light radiation at a substantially lower energy intensity of light radiation than is the case, for example, with mirror-polished surfaces. These dislocations, which can as a rule be detected already to a small extent directly after the action of light radiation, when subjected to high-temperature treatment, such as, for example, oxidation, grow to extensive dislocation networks, which then exhibit their gettering action.

Especially favorable for the production, by means light radiation, of wafer rear sides having a gettering action, is the use of laser radiation in which, by means of the laser beam, usually narrow lines of melted, in most cases overlapping, points are established in the rear side of the wafer. Surprisingly, it was possible to ascertain in this process that, e.g., below a certain energy density of the laser beam used, no dislocations occurred any more in the region of a mirror-polished surface, although the line track of the laser beam was visible on the surface.

To detect the disloations, the wafers were subjected to two hours' oxidation in wet oxygen at 1200° C. (referred to hereinafter as "test oxidation"). With identically treated wafers of which the actual profile exhibited the presence of faces in the fine surface structure that were inclined by at least 15° with respect to the geometrically ideal profile, it was still possible, however, to detect a high dislocation density. Accordingly, for the production of an approximately similarly dense dislocation network in wafers with a fine surface structure of this type, only 20 to 80% of the energy density that is necessary for wafers with a mirror-polished surface is required for the laser radiation.

If, for the production of a gettering dislocation network by means of melting the surface at least in parts, there are chosen for the action of light, especially laser, radiation, semiconductor wafers of which the rear side contains in the fine surface structure faces that are inclined by at least 15° with respect to the geometrically ideal surface, the energy intensity required can be significantly reduced. In principle, it is possible already at reduced energy intensity to achieve local dislocation formation on an otherwise mirror-polished surface at the site of single microface that is inclined by at least 15° with respect to the geometrically ideal surface, but to ensure that dislocation formation is possible on the entire rear side of the wafer, the proportion of faces inclined by at least 15° with respect to the geometrically ideal surface should not be below about 5%, related to the total fine-structured rear face. Roughly, this proportion can be estimated, for example, using a profile section, for example the photograph of a cleavage face, adding the lengths of the stretches inclined by over 15° with respect to the geometrically ideal profile and relating this sum to the total length of the actual profile. Where applicable, any preferred directions of the inclined faces, for example brought about by the use of certain etching processes with preferential direction, and the particular position of the cleavage face, are, however, to be taken into consideration in this estimate.

Methods according to which it is possible to obtain certain desired fine surface structures in semiconductor wafers are known. In particular, etching processes come into consideration for the production of surface structures suitable for the manufacturing process according to the invention. Most advantageous are alkaline etching processes, which result generally in a stepped fine surface structure with relatively steep steps and accordingly faces that are inclined more favorably with respect to the geometrically ideal surface. Thus, for example, excellent results are achieved with customary commercial alkaline-etched silicon wafers, for which usually hot caustic potash solution is used as the etching agent.

By contrast, acid-etched silicon wafers are less suitable, although their use should not be excluded in principle. The production of a surface structure suitable for the process according to the invention is, however, more expensive and more difficult owing to the levelling tendency of acidic etching with respect to the fine surface structure. Furthermore, it is also conceivable to use wafers processed by other etching processes, e.g., plasma etching.

Also, sawn or lapped wafers have in their surface fine structure faces that are inclined by at least 15° with respect to the geometrically ideal surface and are therefore suitable in principle for the manufacturing process according to the invention. It is true though that these wafers, owing to the considerable surface destruction, already have a strong, uncontrolled mechanical damage, so that in a preferred arrangement of the invention these wafers are first etched by alkaline media until damage-free before the action of light, especially laser, radiation. A generally equally possible method comprises initially allowing the light, especially laser, radiation to act as far as a certain depth of penetration, and then carrying off the wafer surface, for example by etching or polishing, down to a fraction of this penetration depth.

The average roughness $R_a$ according to DIN 4768, customary as a measure of the surface quality of semiconductor wafers, can be used only conditionally as a criterion for whether the surface of a semiconductor wafer possesses a fine structure suitable for the process according to the invention. For example, an acid-etched silicon wafer with a particular average roughness, for example $R_a = 0.5$ μm, may have in its fine surface structure no faces inclined by at least 15° with respect to the geometrically ideal surface, while an alkaline-etched wafer of the same average roughness may have numerous such faces. In the case of the preferred alkaline-etched wafers an average roughness range of $R_a =$ from 0.3 to 1.5 μm, preferably from 0.7 to 1.0 μm, has, however, proved especially suitable.

A particular advantage of the manufacturing process according to the invention is that it can be carried out with considerable energy savings, without apparatus modifications, in conventional and customary equipment in which semiconductor wafers are provided, by the action of light, especially laser, radiation, with a rear side having a gettering action in subsequent oxidation processes.

Therefore, there apply, e.g., for the selection of light radiation sources suitable for the particular semiconductor wafers, those criteria that are familiar to the person skilled in the art and are described, inter alia, in the aforementioned patent literature. There are thus suitable as radiation sources in the use of laser radiation, which is preferred by comparison with the equally possible use of, for example, high-pressure flash discharge lamps or high-energy halogen lamps always those lasers that emit light of a wavelength suitable for, i.e., absorbable by, the particular semiconductor material present. There are accordingly advantageously used as a radiation source for silicon wafers, ruby lasers or, especially, Nd:YAG lasers, preferably Q-switched.

When using laser radiation, the laser chosen may be used either in single mode or multi-mode operation, and a suitable radiation intensity profile can be ensured, if necessary, by the use of a diffusor. A particular advantage of the process according to the invention is that, owing to the low energy requirement, lenses with a long focal length can be used which allow the establishment of relatively large-area focal spots on the wafer. Consequently, compared with smooth surfaces, the number of laser pulses required for melting a surface unit area on the wafer can be decreased and the energy requirement reduced. Suitable focal lengths of lenses used for focusing the laser radiation can, as a rule, even lie between 300 and 1000 mm.

Furthermore, the process according to the invention even allows for the laser radiation to strike the wafers to be treated at an angle, as a result of which a further increase in size of the focal spot and thus improvement of the energy expenditure can be achieved. The angle of incidence range suitable here can be varied within wide limits, so that there are many possibilities from approximately perpendicular incidence through an incidence in the region of approximately 45° up to only a glancing incidence of the laser beam acting on the wafer.

A further advantage of the process according to the invention is that overlapping of the surface areas of the semiconductor wafer melted by successive laser pulses is not compulsory. By comparison with conventional processes with overlapping laser pulses, this renders possible a reduction of the number of laser pulses required per wafer for the production of a wafer rear side having a gettering action during subsequent oxidation processes and thus contributes to the reduction of energy needs. In addition, the time required to treat a wafer is made shorter, rendering possible higher throughput rates.

In a further embodiment of the invention, the semiconductor wafers can, before or after the laser treatment, also be subjected in accordance with DE-OS 29 27 220 to a stacking fault-inducing treatment by immersion in a fluidized bath of abrasive grains moved by means of compressed air. This procedure has the advantage that there are formed on the rear side of the wafer, in subsequent oxidation processes, both gettering stacking faults, and also gettering dislocations induced by the laser treatment.

BRIEF DESCRIPTION OF THE DRAWINGS

By way of the following FIGS. 1 to 8 and the Examples, the process and apparatus according to the invention is explained in detail hereinafter.

FIG. 1 shows a cross-section through a mirror-polished, [100]-oriented silicon wafer on the basis of the mirror-like specular [110]-cleavage face;

FIG. 2 shows a cross-section through an alkaline-etched [100]-oriented silicon wafer on the basis of the mirror-like specular [110]-cleavage face (scale as in FIG. 1); and FIG. 3 shows a cross-section through an alkaline-etched [111]-oriented silicon wafer on the basis of the mirror-like specular [110]-cleavage face (scale as in FIG. 1).

FIG. 4 shows the mirror-like specular [110]-cleavage face of a [111]-oriented wafer (scale as in FIG. 1); and FIG. 5 shows the mirror-like specular [110]-cleavage face of a [100]-oriented wafer (scale as in FIG. 1).

FIG. 6 shows the surface of an alkaline-etched [100]-oriented silicon wafer (scale as in FIG. 1);

FIG. 7 shows the surface of a mirror-polished [100]-oriented silicon wafer (scale as in FIG. 1)

DETAILED DESCRIPTION OF THE PREFERRED EMBODIMENTS

EXAMPLE 1

In a customary commercial apparatus suitable for the laser damage treatment of semiconductor wafers, a number of different silicon wafers was subjected to the action of laser radiation of different energy intensities.

A Q-switched Nd:YAG laser of customary design (1.06 μm, continuous wave power max. 5 watts in $TEM_{OO}$, half-width value of the pulses approx. 250 nanoseconds) was used. The beam emitted by the laser was widened by a telescope with ten-fold magnification, passed through a focusing lens having a focal length of 500 mm and was finally directed, by means of two galvanometer mirrors arranged at an angle of 90°, approximately perpendicularly onto the wafer to be processed. This arrangement allowed a beam deflection of approximately ±6° with respect to the vertical. By means of this deflectable laser beam, approximately 230 parallel lines (line spacing 0.43 mm) of melted dots (diameter approximately 30 to 35 μm) overlapping by approximately 15% of their area, were applied to the wafers selected. This treatment lasted for approximately 1 minute per wafer.

The silicon wafers selected were customary commercial alkaline-etched [100]-wafers, [100]-wafers polished on one side, alkaline-etched [111]-wafers and [111]-wafers polished on one side.

The invention will now be described by way of several examples which are given by way of illustration and not of limitation.

Figure 1:
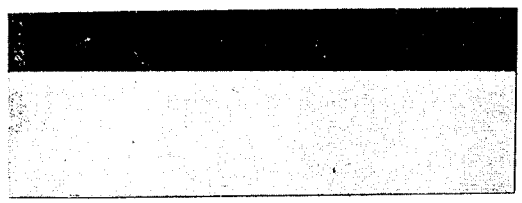
In FIGS. 1 to 3, to clarify Example 1 the fine surface structures of polished and of alkaline-etched silicon wafers are shown by way of profile sections. In particular.

In FIG. 1 there is shown as an example of the fine surface structure of a smooth wafer, the mirror-like specular [110]-face of a polished [100]-silicon wafer.

Figure 2:

FIG. 2 shows the mirror-like specular [110]-cleavage face of an alkaline-etched [100]-oriented silicon wafer which has in the fine surface structure numerous faces inclined by at least 15° with respect to the geometrically ideal surface.

Figure 3:

FIG. 3 shows the mirror-like specular [110]-cleavage face of an alkaline-etched [111]-oriented silicon wafer of which the fine surface structure likewise contains faces inclined by at least 15° with respect to the geometrically ideal surface.

In each case, ten of these wafers were subjected to laser treatment on their etched or polished surface, the laser radiation acting on the rear side of the wafer in each case at the pulse energy and pulse frequency shown in the Table. Subsequently, the wafers were polished in customary manner on the untreated side and then, to demonstrate the activity of the laser damage, subjected to a two-hour test oxidation in wet oxygen at 1200° C. Finally, after removing the oxide, the wafers were etched for two minutes in Secco solution and the dislocation etch pits that could be seen by microscope along the lines were counted. The number of dislocation etch pits found on the respective silicon wafers per mm of line length of the laser track is shown in the Table. It can be seen from this that on silicon wafers that contain in the fine surface structure faces with an inclination of at least 15° in the actual profile by comparison with the geometrically ideal surface profile, a gettering dislocation network can be produced by means of laser radiation at a significantly lower energy cost compared with silicon wafers having a smooth surface. Accordingly, the polished front side of all alkaline-etched, treated silicon wafers was free from defects. On the other hand, in the case of wafers 1 to 8 in which the laser radiation had acted on the smooth polished face, the phenomenon of so-called "haze" or "fog", indicating defects, could be observed on the front side in the collimated light. A high density of so-called "small pits" could be observed under the microscope.

is dislocation-free. In comparison, in addition to the still clearly visible line track of the laser, it exhibits a large number of so-called "small pits".

EXAMPLE 4

An alkaline-etched silicon wafer ([100]-orientation, $R_a = 0.70$ μm, surface profile as in FIG. 2) was subjected in the arrangement described in Example 1 to the

TABLE

| | | | Number of dislocation etch pits per mm of line length | | | |
|---|---|---|---|---|---|---|
| Wafer | Pulse Energy [mJ] | Pulse Frequency [kHz] | [111]-Orientation rear side alkaline-etched | [111]-Orientation rear side Polished | [100]-Orientation rear side alkaline-etched | [100]-Orientation rear side Polished |
| 1 | 0.17 | 25 | 150 | — | 300 | — |
| 2 | 0.20 | 22 | 600 | — | 1100 | — |
| 3 | 0.22 | 20 | 1400 | — | 1300 | — |
| 4 | 0.25 | 18 | 1100 | — | 1000 | — |
| 5 | 0.28 | 16 | 1400 | — | 1300 | — |
| 6 | 0.31 | 14 | 1500 | — | 1200 | — |
| 7 | 0.36 | 12 | 2100 | — | 1000 | — |
| 8 | 0.42 | 10 | 1600 | — | 1800 | — |
| 9 | 0.51 | 8 | 2000 | 1900 | 1600 | 1200 |
| 10 | 0.56 | 7 | 1300 | 1700 | 1400 | 900 |

EXAMPLE 2

Figure 4:
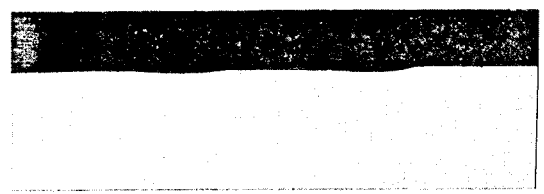
In FIGS. 4 and 5, to clarify Example 2 the fine surface structures of acid-etched silicon wafers are illustrated by means of profile sections. In particular.
Figure 5:
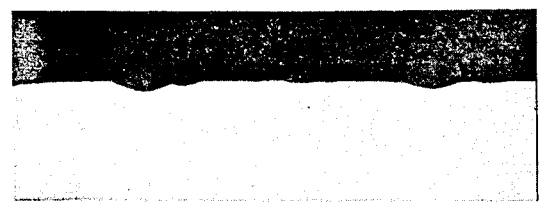

To produce the fine surface structure shown in FIG. 4, a [111]-oriented, sawn and lapped silicon wafer A was treated in a CP6 etching medium (45.4% concentrated $HNO_3$, and in each case 27.3% of 40% strength HF and 98% strength glacial acetic acid) to an erosion depth of 30 μm; the wafer then had an average roughness $R_a$ of 0.23 μm and the fine surface structure contained only faces that were inclined by less than 15° in the actual profile by comparison with the geometrically ideal surface profile (cf. FIG. 4). Also, a [100]-oriented, sawn and lapped silicon wafer B was treated in a CP6-etching medium to an erosion depth of 15 μm. The wafer then exhibited the fine surface structure shown in FIG. 5 with faces inclined by more than 15° in the actual profile by comparison with the geometrically ideal surface profile.

Both wafers were subjected to the action of laser radiation with a pulse energy of 0.28 mJ in the manner described in Example 1. After corresponding working up of the wafers (i.e., polishing on one side, oxidation in wet oxygen, and Secco etching) it was not possible to detect any dislocation etch pits along the laser treatment lines in wafer A and the front side of the wafer exhibited numerous "small pits". By contrast, wafer B exhibited a front side free from defects and numerous dislocation etch pits along the laser treatment lines on the rear side.

EXAMPLE 3

Figure 6:
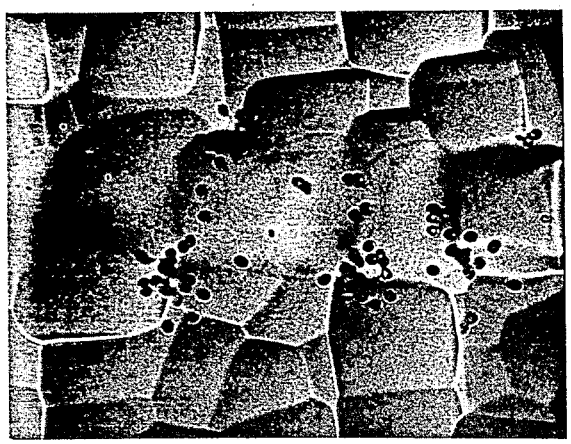
FIGS. 6 and 7 show parts of the surfaces of silicon wafers which, in accordance with Example 3, are subjected to an identical treatment by laser action, test oxidation and Secco etching. In particular.
Figure 7:
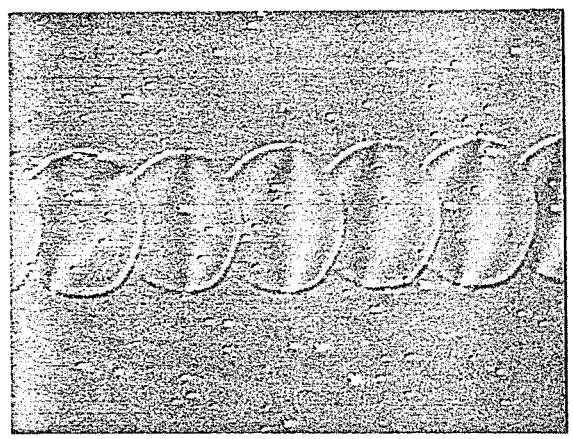

In each case an alkaline-etched ($R_a = 0.70$ μm) and a mirror-polished, [100]-oriented silicon wafer was, in the manner described in Example 1, subjected in the same manner to the action of laser radiation of a pulse energy of 0.30 mJ. It was then possible to observe on both wafer surfaces, under the microscope, the line tracks of overlapping round melted areas. Subsequently, the wafers were subjected to the test oxidation with subsequent Secco etching described in Example 1. The resulting surfaces are compared in FIG. 6 (alkaline-etched wafer) and FIG. 7 (mirror-polished wafer). While in FIG. 6 the alkaline-etched wafer displays numerous dislocation etch pits along the still faintly visible line track of the laser, in FIG. 7 the mirror-polished surface action of laser radiation. To deflect the laser beam only one movable galvanometer mirror was, however, used. This arrangement allowed the beam (pulse energy 0.9 mJ, pulse repetition frequency 2 kHz) to be incident at an angle of 10° with respect to the wafer surface. The beam in this case swept over the wafer surface in each case in the form of a line, the wafer was then displaced in the direction of the beam by the desired line spacing and swept over by the beam again. After processing the entire wafer the untreated surface was polished and then the treatment by oxidation and Secco etching described in Example 1 was carried out. Dislocation etch pits distributed over the entire rear side of the wafer could be detected. The front side of the wafer was free from defects.

EXAMPLE 5

Figure 8:
FIG. 8 shows the surface of a silicon wafer treated according to Example 5 with stacking faults and dislocations (scale as in FIG. 1).

Alkaline-etched silicon wafers ([100]-orientation, $R_a = 0.70$ μm, surface profile as in FIG. 2) were, in the manner described in Example 1, subjected to the action of a laser beam with a pulse energy of 0.35 mJ and a pulse repetition frequency of 8 kHz. The beam deflection was so adjusted that the successive melted points on the wafer surface overlapped each other by 40% of their diameter. Subsequently the wafers were, in accordance with DE-OS 29 27 220, immersed in a fluidized bath of abrasive grains moved by means of compressed air for the stacking fault-inducing treatment. The wafers were then cleaned, polished on the unradiated side, oxidized for 2 hours at 1100° C. in wet oxygen and Secco etched. It was possible to detect on the rear side of the wafer, which is shown in FIG. 8, both stacking faults and dislocations. No defects at all could be detected on the front side of the wafer.

What is claimed is:

1. A process for the manufacture of semiconductor wafers with a rear side having a gettering action by the action of light radiation so as to induce a gettering dislocation network in subsequent high-temperature processes, comprising the steps of:
    selecting semiconductor wafers each having a rear side that contains in its fine surface structure faces that are inclined by at least 15° with respect to the geometrically ideal surface of the wafer; and melting parts of the rear sides of said wafers by the action of light radiation so as to induce a gettering dislocation network in the surface region of the rear side of the wafers, the incident energy density of said light radiation employed in said melting step being 20 to 80% of the energy density that is necessary for producing a similarly dense dislocation network in a mirror-polished surface of a wafer.

2. The process of claim 1, wherein laser light is used as said light radiation.

3. The process of claim 1, wherein alkaline-etched semiconductor wafers are selected.

4. The process of claim 1, wherein said selected semiconductor wafers are subjected to a stacking fault-inducing treatment.

5. The process of claim 1, wherein said wafers selected are damage-free.

6. The process of claim 1, wherein said light radiation employed in said melting step is of an intensity which avoids vaporization of said rear side of said wafers.

7. A process for the manufacture of semiconductor wafers with a rear side having a gettering action by the action of light radiation so as to induce a gettering dislocation network in subsequent high-temperature processes, comprising the steps of:

selecting damage-free semiconductor wafers each having a rear side that contains in its fine surface structure faces that are inclined by at least 15° with respect to the geometrically ideal surface of the wafer; and melting parts of the rear sides of said wafers by the action of light radiation so as to induce a gettering dislocation network in the surface region of the rear side of the wafers.

8. The process of claim 7, wherein the incident energy density of said light radiation employed in said melting step is 20 to 80% of the energy density that is necessary for producing a of a wafer.

9. The process of claim 7, wherein laser light is used as said light radiation.

10. The process of claim 7, wherein alkaline-etched semiconductor wafers are selected.

11. The process of claim 7, wherein said selected semiconductor wafers are subjected to a stacking fault-inducing treatment.

12. The process of claim 7, wherein said light radiation employed in said melting step is of an intensity which avoids vaporization of said rear side of said wafers.

* * * * *